(12) United States Patent
Chakravarty

(10) Patent No.: US 8,583,973 B1
(45) Date of Patent: Nov. 12, 2013

(54) STORED-PATTERN LOGIC SELF-TESTING WITH SERIAL COMMUNICATION

(71) Applicant: LSI Corporation, San Jose, CA (US)

(72) Inventor: Sreejit Chakravarty, Mountain View, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/773,716

(22) Filed: Feb. 22, 2013

(51) Int. Cl.
  *G01R 31/28* (2006.01)
(52) U.S. Cl.
  USPC .......................................... 714/733; 714/727
(58) Field of Classification Search
  None
  See application file for complete search history.

(56) References Cited

U.S. PATENT DOCUMENTS

| | | | | |
|---|---|---|---|---|
| 7,284,175 | B2 * | 10/2007 | Wang et al. | 714/727 |
| 7,313,739 | B2 * | 12/2007 | Menon et al. | 714/718 |
| 7,353,440 | B2 * | 4/2008 | Ohwada et al. | 714/726 |
| 7,550,995 | B1 * | 6/2009 | Guilloteau et al. | 326/38 |
| 7,568,141 | B2 * | 7/2009 | Menon et al. | 714/727 |
| 2002/0138801 | A1 * | 9/2002 | Wang et al. | 714/729 |
| 2004/0128596 | A1 * | 7/2004 | Menon et al. | 714/724 |
| 2005/0240850 | A1 * | 10/2005 | Ohwada et al. | 714/738 |
| 2007/0168803 | A1 * | 7/2007 | Wang et al. | 714/726 |
| 2008/0104466 | A1 * | 5/2008 | Menon et al. | 714/727 |
| 2008/0256407 | A1 * | 10/2008 | Selva et al. | 714/732 |
| 2011/0214026 | A1 * | 9/2011 | Rajski et al. | 714/726 |
| 2013/0077421 | A1 * | 3/2013 | Wang et al. | 365/201 |

* cited by examiner

*Primary Examiner* — Guerrier Merant
(74) *Attorney, Agent, or Firm* — Mendelsohn, Drucker & Dunleavy, P.C.; Steve Mendelsohn

(57) ABSTRACT

An integrated circuit chip that supports stored-pattern (SP) logic built-in self-testing (LBIST) includes a device under test (DUT) and a test controller. System-level SP LBIST testing is performed using an external, system ATE (automated test equipment) that transmits test input data to the test controller for application to the DUT, which generates test output data that is transmitted from the test controller to the system ATE, which performs golden signature comparisons on the test output data. During system-level DUT testing, all communications between the system ATE and the chip are via a single interface, such as a conventional, serial JTAG port.

6 Claims, 3 Drawing Sheets

SP_LBIST_MODE_STATUS

SCAN_TEST_DATA_BUFFER

STORED-PATTERN LOGIC SELF-TESTING WITH SERIAL COMMUNICATION

CROSS-REFERENCE TO RELATED APPLICATIONS

The subject matter of this application is related to the subject matter of co-pending application Ser. No. 12/985,604 ("the '604 patent application"), filed on Jan. 6, 2011, the teachings of which are incorporated herein by reference in their entirety.

TECHNICAL FIELD

This application is directed, in general, to an electronic device, and, more specifically, to self-testing thereof.

BACKGROUND

An electronic device such as an integrated circuit (IC) sometimes includes self-test circuitry that may be used to determine device functionality of the IC before or after deployment of the device in a product. The self-test circuitry may include scan chains used to test combinatorial logic on the IC. The scan chains are typically configured with a series of test patterns to test functionality of the IC at the end of the manufacturing line before the IC is shipped to a customer.

BRIEF DESCRIPTION

Reference is now made to the following descriptions taken in conjunction with the accompanying drawings, in which.

DETAILED DESCRIPTION

Many complex IC devices include a scan chain used to functionally test combinatorial logic in the IC typically during an end-of-line, device-level test. A tester system typically provides test patterns (aka test vectors, test input data) to the scan chains, and reads test results (aka test output data) from the scan chain. Such testing is useful for detecting and sequestering ICs that include fatal manufacturing defects and ICs that may suffer from early failure after a short period of operation. In many cases, after the IC leaves the manufacturing facility, the scan chain is thereafter unused.

This disclosure benefits from the recognition by the inventor that the scan chain infrastructure on the IC may be advantageously used after the IC leaves the manufacturing environment. The '604 patent application describes a BIST (built-in self-testing) technique in which test patterns are stored in a nonvolatile memory associated with the IC. On device startup, or periodically, a controller associated with the IC initiates and manages a test of the combinatorial logic (aka the device under test or DUT) using the test patterns. The results of the test may be used to modify operation of the IC, such as reporting the test error or disabling further operation of the IC to prevent generation of spurious results in the system employing the IC.

The '604 patent application describes a BIST architecture that includes a device under test (DUT), a system test controller, and a memory. The memory stores all of the data needed to perform the BIST testing, including configuration data for configuring the DUT for BIST testing, test input data to be provided to the DUT for the BIST testing, and information (referred to as the "golden signature" data) characterizing the desired test output data generated by the DUT during the BIST testing for that test input data. The controller is responsible for (i) configuring the DUT for the BIST testing, (ii) providing the test input data to the DUT, (iii) receiving the resulting test output data from the DUT, and (iii) evaluating the test output data with respect to the corresponding golden signature data to determine whether the DUT passed or failed the BIST testing. In this BIST architecture, system-level automatic testing equipment (ATE), which is external to the circuit board on which the DUT is configured, instructs the controller to initiate the BIST testing, and the controller informs the system-level ATE when the BIST testing is complete and whether the DUT passed or failed the BIST testing.

According to the '604 patent application, the controller, memory, and DUT are all configured on the same circuit board and possibly even on the same integrated circuit (IC) chip. For example, in one implementation, the DUT and the controller are implemented on the same chip, which is itself mounted on the same circuit board as the memory, which is external to the chip.

Figure 1:
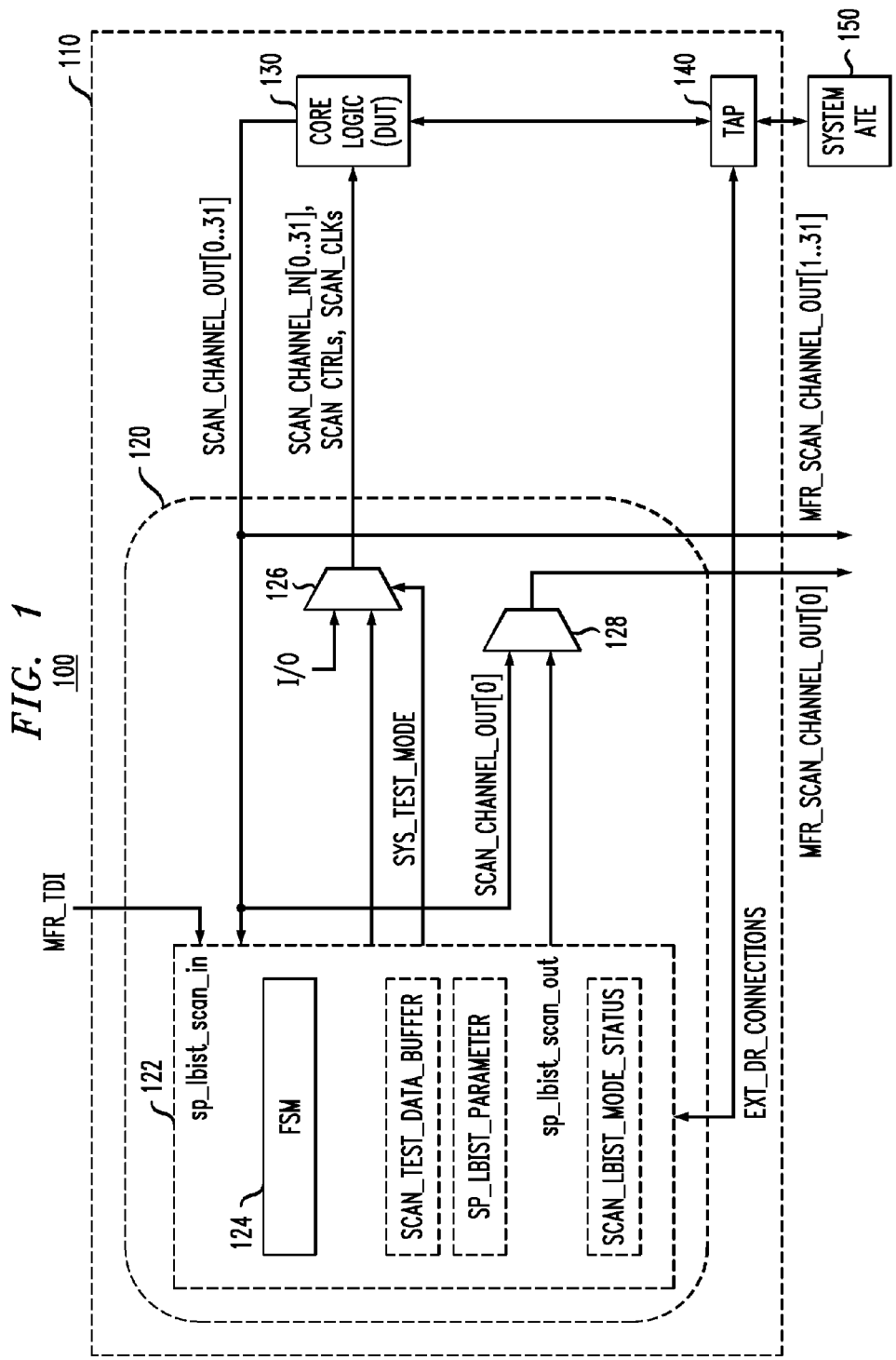
FIG. 1 shows a block diagram of a built-in self-testing (BIST) architecture.

FIG. 1 shows a block diagram of an alternative BIST architecture 100, where a testing controller 120 and the DUT (e.g., core logic) 130 are implemented on the same chip 110, and there is no board-level memory that stores data for BIST testing of the DUT. Instead, that data is stored in an external system ATE 150, which communicates with both the logic core 130 and the testing controller 120 via a single, on-chip tap 140, which may be a conventional, serial JTAG (Joint Test Action Group) port. Note that, in alternative implementations, tap 140 can be internal to logic core 130.

According to BIST architecture 100, testing controller 120 is not responsible for making the ultimate determination as to whether BIST testing was successful. In particular, testing controller 120 is not responsible for comparing the BIST test output data with corresponding golden signature data to detect errors in the BIST testing. Rather, controller 120 simply receives configuration and test input data from system ATE 150 via TAP 140, configures the logic core for the BIST testing, provides the test input data to the logic core, receives the resulting test output data from the logic core, and forwards that test output data via TAP 140 to system ATE 150, which is responsible for storing the golden signature data and evaluating the test output data to determine whether the logic core passed or failed the BIST testing.

As shown in FIG. 1, on-chip testing controller 120 has stored-pattern (SP) logic BIST (LBIST) module 122, input data mux 126, and output data mux 128, where SP LBIST module 122 has finite state machine (FSM) 124, which provides the functionality of SP LBIST module 122, and a number of registers/buffers including:

SCAN_TEST_DATA_BUFFER: On-chip memory that temporarily buffers test input data and/or test output data;

SP_LBIST_PARAMETER: Stores parameter values for controlling SP LBIST testing; and SP_LBIST_MODE_STATUS: Stores data indicating status of SP LBIST testing.

Chip 110 supports (at least) two different types of testing of logic core 130: device-level testing and system-level testing. Device-level testing is typically performed by the manufacturer of chip 110 before the chip is assembled onto its final (e.g., product) circuit board, while system-level testing is typically performed by a customer of the manufacturer after the chip is assembled onto its final circuit board. During device-level testing, a device-level ATE (not shown in FIG. 1) is connected to access chip 110 via tap 140 as well as one or more other I/O ports on the chip, and SP LBIST module 122 is not used. FIG. 1 represents the configuration of chip 110 for system-level BIST testing in which system ATE 150 accesses chip 110 only via tap 140, and SP LBIST module 122 is used.

During device-level testing, input data mux 126 is configured to select input (i.e., configuration and test) data provided by the device-level ATE to chip 110 via I/O ports. Along with appropriate clock signals, that input data is applied by mux 126 to logic core 130 as the following signals. There is one I/O port for each of the following signals:

SCAN_CHANNEL_IN[0, . . . , 31]: 32-bit test input data for logic core 130;
SCAN_CTRLs: One or more configuration signals for logic core 130; and
SCAN_CLKs: One or more clock signals for logic core 130.

The device-level ATE can also configure the logic core 130 for device-level testing using high-speed clocks generated by on-chip PLLs (phase-locked loops). These PLLs can be configured via tap 140. In response, logic core 130 generates 32-bit test output data SCAN_CHANNEL_OUT[0, . . . , 31], where the first bit SCAN_CHANNEL_OUT[0] is transmitted to the device-level ATE via output data mux 128 as MFR_SCAN_CHANNEL_OUT[0], while the remaining 31 bits are directly transmitted to the device-level ATE as MFR_SCAN_CHANNEL_OUT[1, . . . , 31], without going through an output data mux. MFR_SCAN_CHANNEL_OUT[0] is treated differently from the other MFR_SCAN_CHANNEL_OUT bits, because this channel is shared by the ATE to test both the core logic 130 as well as the BIST controller itself. Mux 128 is configured by the ATE via the TAP to select one of these two modes. For BIST mode testing of logic core 130, the SCAN_CHANNEL_OUT[0] data from logic core 130 is routed to the I/O. For the test of the BIST controller, lsi_splbist_scan_out is routed to the I/O to be monitored by the ATE.

As represented in FIG. 1, during system-level testing, system ATE 150 communicates with chip 110 only via tap 140. In particular, system ATE 150 transmits the test configuration data and the test input data for logic core 130 to SP LBIST module 122 of controller 120 via tap 140. The test input data is temporarily stored in the buffer SCAN_TEST_DATA_BUFFER, and the test configuration data is stored in the register SP_LBIST_PARAMETER before they are provided, along with appropriate clock signals, to logic core 130 via input data mux 126 as the signals SCAN_CHANNEL_IN[0, . . . , 31], SCAN_CTRLs, and SCAN_CLKs, respectively. Similar to the device-level testing, system ATE 150 configures the logic core 130 for system-level testing using (e.g., PLL configuration) commands transmitted directly to logic core 130 via tap 140. In response and again similar to the device-level testing, logic core 130 generates 32-bit test output data SCAN_CHANNEL_OUT[0, . . . , 31]. In the case of system-level testing, however, all 32 bits of the test output data are temporarily stored in the buffer SCAN_TEST_DATA_BUFFER before being serially transmitted off chip via output data mux 128 and tap 140 to system ATE 150.

Figure 2:
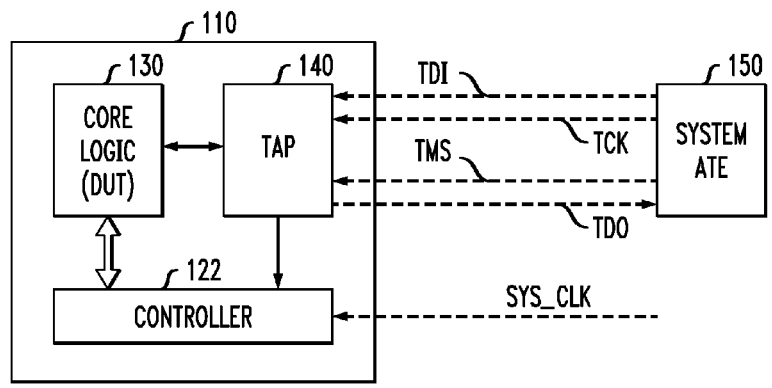
FIG. 2 shows a block diagram of an alternative representation of the BIST architecture of FIG. 1.

FIG. 2 shows a block diagram of a representation of BIST architecture 100 of FIG. 1 indicating more details about the interface between system ATE 150 and chip 110 for system-level testing. As shown in FIG. 2, test input data TDI, TAP control signal TMS, and TAP clock TCK are transmitted from system ATE 150 to the BIST controller via tap 140. The BIST controller in turn generates the test data and the corresponding test clocks and test control signals which are applied to the core logic 130. The resulting test output data from the core logic is intercepted by the BIST controller and subsequently transmitted to the ATE 150 via the TAP 140 serial output TDO. The TDO is monitored by the ATE 150.

System-level testing of logic core 130 can be described in terms of four phases:
Phase 1: Test Setup
Phase 2: Initiation of SP LBIST Module
Phase 3: Test Execution
Phase 4: Test Completion In one implementation, system ATE 150 communicates with SP LBIST module 122 using the JTAG P1149.1 protocol via the three registers/buffers SP_LBIST_PARAMETER, SCAN_TEST_DATA_BUFFER, and SP_LBIST_MODE_STATUS), which are configured as external DR registers. External DR registers are registers within the chip 110 that are interfaced to the TAP 140 so that the serial data coming into the TDI input of the TAP 140 can be loaded into these registers. The TAP is first configured to select one of the external DRs before data is loaded into it.

During Phase 1, system ATE 150 loads test configuration data for the SP LBIST test into the register SP_LBIST_PARAMETER via the TMS signal of FIG. 2.

Figure 3:
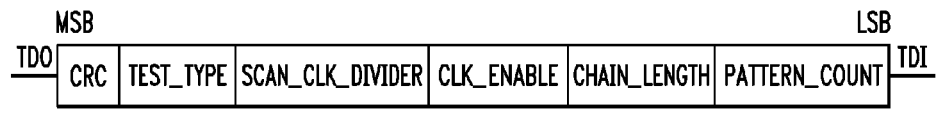
FIG. 3 shows a representation of the format of the register SP_LBIST_PARAMETER in the BIST architecture of FIG. 1.

FIG. 3 shows a representation of the format of the register SP_LBIST_PARAMETER, where:

32-bit CRC is the golden (i.e., expected) cyclic redundancy check signature for contents of the register SP_LBIST_PARAMETER and SCAN_TEST_DATA_BUFFER;
3-bit Test_Type indicates the type of testing to be performed. Different kinds of tests can be applied to the core logic 130. They differ in the kind of control signals and clocks that are applied. Some examples of such tests are stuck-at tests, transition delay tests, chain test, etc. The content of this 3-bit field indicates the kind of test that will be applied.
4-bit Scan_clk_divider indicates the factor by which the speed of the clock used at the serial interface of tap 140 needs to be slowed down in generating the clock signals SCAN_CLKs applied to the logic core;
X-bit CLK_ENABLE is the number of scan clocks at the boundary of the core logic 130;
The content of the chain_length field indicates the number of scan shift clocks to be applied to load one test stimulus into the core logic 130; and
The content of pattern_count indicates the number of test stimuli to be applied for the current BIST testing session.

During Phase 2, system ATE 150 initiates the SP LBIST testing. This is done by loading a specific data pattern into the SP_LBIST_MODE_STATUS register via the tap 140. This pattern sets the Start_bit of this register to 1. Once the START bit is set to 1, the BIST controller takes control of the scan channels, the scan clocks, and the scan control signals going into the core logic 130 by configuring the mux 126.

Figure 4:
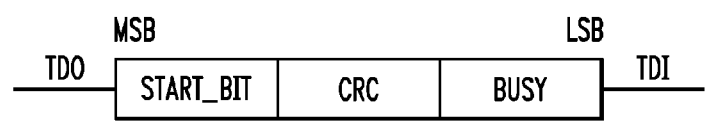
FIG. 4 shows a representation of the format of the register SP_LBIST_MODE_STATUS in the BIST architecture of FIG. 1.

FIG. 4 shows a representation of the format of the register SP_LBIST_MODE_STATUS, where:

1-bit Start_bit, where a value of 0 indicates idle (i.e., no testing), and a value of 1 indicates execution of testing. Start_bit is cleared after the current SP LBIST test is complete;

1-bit CRC, where a value of 0 indicates that the CRC check passed, and a value of 1 indicates that the CRC check failed;

1-bit BUSY is set to a value of 1 when SP LBIST test mode starts and cleared to a value of 0 when SP LBIST test mode is complete. The BUSY bit is different from the START bit in that the tap 140 can read the content of the BUSY bit but not the START bit. In addition, the tap 140 can modify the START bit but cannot modify the BUSY bit. This BUSY bit is monitored by the ATE 150 via the tap 140 to determine if the test session has completed or not.

During Phase 3, SP LBIST testing is executed. In particular, during Phase 3, a number of scan loads are executed equal to one more than the value stored in the field Pattern_Count of the register SP_LBIST_PARAMETER during Phase 1. The amount of input and output data in each scan load is based on the value stored in the field Chain_length of the register SP_LBIST_PARAMETER during Phase 1.

During each scan load, SP LBIST module 122 loads another subset of test input data stored in SCAN_TEST_DATA_BUFFER into logic core 130 via input data mux 126. In addition, during each scan load, SP LBIST module 122 reads out another subset of test output data, corresponding to the subset of test input data from the previous scan load, from logic core 130 for buffering in SCAN_TEST_DATA_BUFFER, from which system ATE 150 reads the test output data via output data mux 128 and tap 140 as the TDO signal of FIG. 2. System ATE 150 compares each subset of test output data to appropriate golden signature data, where a mismatch would indicate that the SP LBIST test has failed.

During the first scan load, the first subset of test input data is loaded into logic core 130, and the test output data read out from logic core 130 during that first scan load is ignored. The extra scan load (i.e., one more than Pattern_Count) is used to shift out the last subset of test output data corresponding the previously loaded, last subset of test input data. During that last scan load, no new test input data is loaded into logic core 130.

Figure 5:
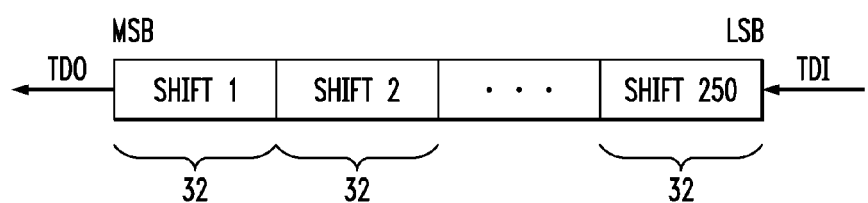
FIG. 5 shows a representation of the format of the register SCAN_TEST_DATA_BUFFER in the BIST architecture of FIG. 1.

FIG. 5 shows a representation of the format of the register SCAN_TEST_DATA_BUFFER for a particular SP LBIST test in which there are Pattern_Count=250 scan loads, each scan load having Chain_length=32 bits. As such, during each scan load, 32 bits of test input data are applied to logic core 130 by SP LBIST module 122, and 32 bits of test output data are read out from logic core 130 by SP LBIST module 122 and from SP LBIST module 122 by system ATE 150 via output data mux 128 and tap 140.

During Phase 4, the SP LBIST test is completed by checking the status of the test. This is done by the ATE 150 reading out the content of the SP_LBIST_MODE_STATUS register via the tap 140. The ATE checks the content of the BUSY bit and the CRC bit. For the test to pass, the BUSY bit must be set to 0 and the CRC bit must be set to 0.

SP LBIST module 122 then relinquishes control of the logic core scan clocks, scan control signals, and input and output scan channels. In addition, SP LBIST module 122 resets the register SP_LBIST_MODE_STATUS such that the fields Start_bit and BUSY are both 0, while the field CRC indicates the result of the CRC check.

Those skilled in the art to which this application relates will appreciate that other and further additions, deletions, substitutions and modifications may be made to the described embodiments.

What is claimed is:

1. An apparatus comprising an integrated circuit (IC) chip (e.g., 110) comprising:
    a logic core (e.g., 130);
    a built-in self-test (BIST) module (e.g., 122); and
    an interface (e.g., 140) that enables external test equipment (e.g., 150) to communicate with the chip, wherein, for BIST testing:
        the test equipment is external to a circuit board on which the chip is configured;
        the test equipment transmits test input data to the BIST module via the interface;
        the BIST module applies the test input data to the logic core;
        the logic core processes the test input data to generate test output data;
        the BIST module receives the test output data from the logic core;
        the BIST module transmits the test output data to the test equipment via the interface;
        the BIST module is not configured to compare the test output data to golden signature test data;
        the test equipment is configured to compare the test output data to the golden signature test data to determine whether or not the BIST testing was successful; and
        the BIST module is configured to (i) generate a cyclic redundancy check (CRC) value for the BIST testing and (ii) compare the CRC value to a golden CRC value stored in the BIST module.

2. The invention of claim 1, wherein the interface is a serial JTAG interface.

3. The invention of claim 1, wherein the BIST module comprises registers for temporarily storing the test input data and the test output data.

4. The invention of claim 1, wherein the chip is configurable to support device-level testing independent of the BIST module.

5. The invention of claim 1, wherein the apparatus is the integrated circuit.

6. The invention of claim 1, wherein the apparatus is a circuit board on which the integrated circuit is configured.

* * * * *